(12) United States Patent
Frantz et al.

(10) Patent No.: US 11,610,844 B2
(45) Date of Patent: Mar. 21, 2023

(54) HIGH PERFORMANCE MODULE FOR SIP

(71) Applicant: Octavo Systems LLC, Sugar Land, TX (US)

(72) Inventors: Gene Alan Frantz, Sugar Land, TX (US); Masood Murtuza, Sugar Land, TX (US); Erik James Welsh, Bellaire, TX (US); Peter Robert Linder, Sugar Land, TX (US)

(73) Assignee: Octavo Systems LLC, Sugar Land, TX (US)

( * ) Notice: Subject to any disclaimer, the term of this patent is extended or adjusted under 35 U.S.C. 154(b) by 0 days.

(21) Appl. No.: 16/755,376

(22) PCT Filed: Oct. 11, 2018

(86) PCT No.: PCT/US2018/055420
§ 371 (c)(1),
(2) Date: Apr. 10, 2020

(87) PCT Pub. No.: WO2019/075205
PCT Pub. Date: Apr. 18, 2019

(65) Prior Publication Data
US 2020/0243451 A1    Jul. 30, 2020

Related U.S. Application Data

(60) Provisional application No. 62/571,031, filed on Oct. 11, 2017.

(51) Int. Cl.
*H01L 23/52* (2006.01)
*H01L 23/538* (2006.01)
(Continued)

(52) U.S. Cl.
CPC ......... *H01L 23/5383* (2013.01); *G11C 5/04* (2013.01); *H01L 21/56* (2013.01);
(Continued)

(58) Field of Classification Search
CPC ... H01L 23/5383; H01L 21/56; H01L 23/498; H01L 23/5386; H01L 24/16;
(Continued)

(56) References Cited

U.S. PATENT DOCUMENTS 9,780,042 B2 * 10/2017 Woychik ............ H01L 25/0652
10,347,585 B2 * 7/2019 Shin .................... H01L 24/92
(Continued)

FOREIGN PATENT DOCUMENTS

TW    200939451 A    9/2009
TW    201432871 A    8/2014
(Continued)

OTHER PUBLICATIONS

International Search Report and Written Opinion issued for International Application No. PCT/US2018/055420 dated Jan. 25, 2019, 10 pages.

*Primary Examiner* — Nicholas J Tobergte
(74) *Attorney, Agent, or Firm* — Rothwell, Figg, Ernst & Manbeck, P.C.

(57) ABSTRACT

High performance modules for use in System-in-Package (SIP) devices, and methods of manufacture for such modules and SIPs. The modules employ one or more interposer substrates on which high performance components and/or devices are operatively mounted and interconnected.

16 Claims, 13 Drawing Sheets

(51) Int. Cl.
*G11C 5/04* (2006.01)
*H01L 21/56* (2006.01)
*H01L 23/31* (2006.01)
*H01L 23/498* (2006.01)
*H01L 23/00* (2006.01)
*H01L 25/065* (2023.01)

(52) U.S. Cl.
CPC ........ *H01L 23/3128* (2013.01); *H01L 23/498* (2013.01); *H01L 23/5386* (2013.01); *H01L 24/16* (2013.01); *H01L 25/0652* (2013.01); *H01L 25/0655* (2013.01); *H01L 25/0657* (2013.01); *H01L 2924/15311* (2013.01)

(58) Field of Classification Search
CPC ............. H01L 25/0652; H01L 25/0655; H01L 25/0657; H01L 2924/15311; G11C 5/04
See application file for complete search history.

(56) References Cited

U.S. PATENT DOCUMENTS

| | | | |
|---|---|---|---|
| 10,468,384 B2 * | 11/2019 | Yang | .................... H01L 25/0657 |
| 10,636,765 B2 * | 4/2020 | Yang | ........................ H01L 25/50 |
| 2007/0057357 A1 * | 3/2007 | Chen | .................... H01L 25/0657 |
| | | | 257/E23.179 |
| 2007/0096287 A1 * | 5/2007 | Araki | ...................... H01L 25/50 |
| | | | 257/E21.705 |
| 2013/0058067 A1 | 3/2013 | Yee. et al. | |
| 2013/0120021 A1 * | 5/2013 | Chi | ...................... G11C 29/886 |
| | | | 257/777 |
| 2013/0134607 A1 * | 5/2013 | Gillingham | ......... H01L 25/0657 |
| | | | 257/782 |
| 2014/0217604 A1 | 8/2014 | Chou et al. | |
| 2015/0143037 A1 | 5/2015 | Smith | |
| 2016/0190109 A1 * | 6/2016 | Lee | .................... H01L 25/0652 |
| | | | 257/784 |
| 2016/0300815 A1 * | 10/2016 | Kim | ........................ H01L 24/94 |
| 2016/0379961 A1 | 12/2016 | Lee et al. | |
| 2016/0379967 A1 | 12/2016 | Gamini | |
| 2017/0117198 A1 | 4/2017 | Kim et al. | |
| 2017/0221868 A1 | 8/2017 | Kim et al. | |

FOREIGN PATENT DOCUMENTS

| | | |
|---|---|---|
| TW | 201442203 A | 11/2014 |
| TW | 201445696 A | 12/2014 |
| WO | 2014158388 A1 | 10/2014 |

\* cited by examiner

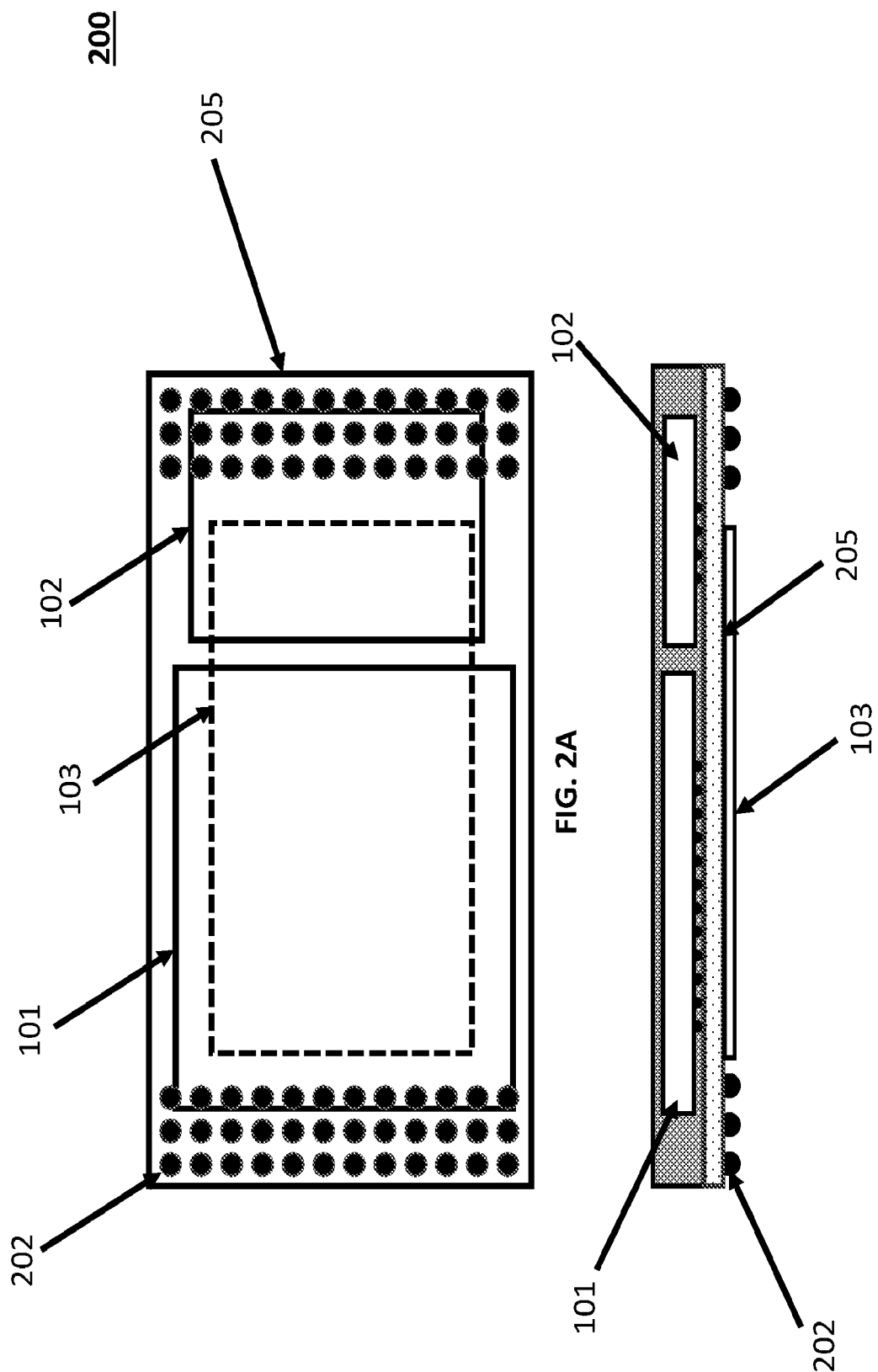

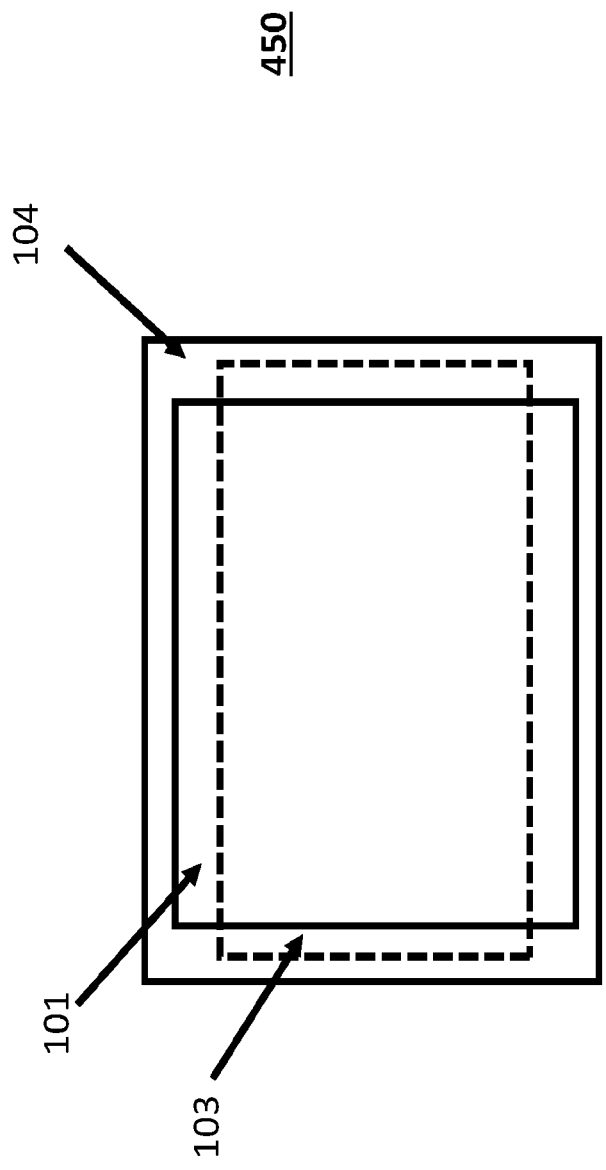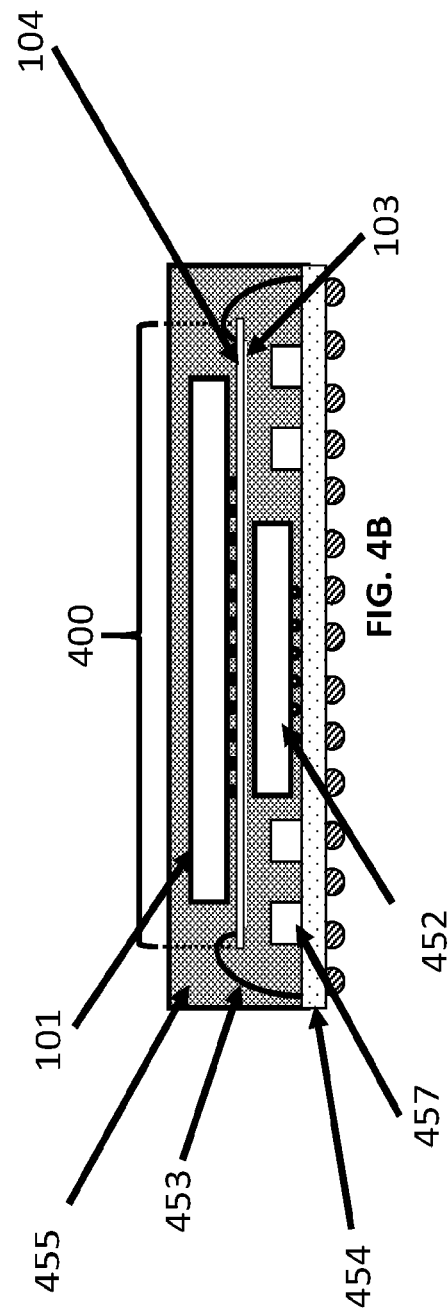

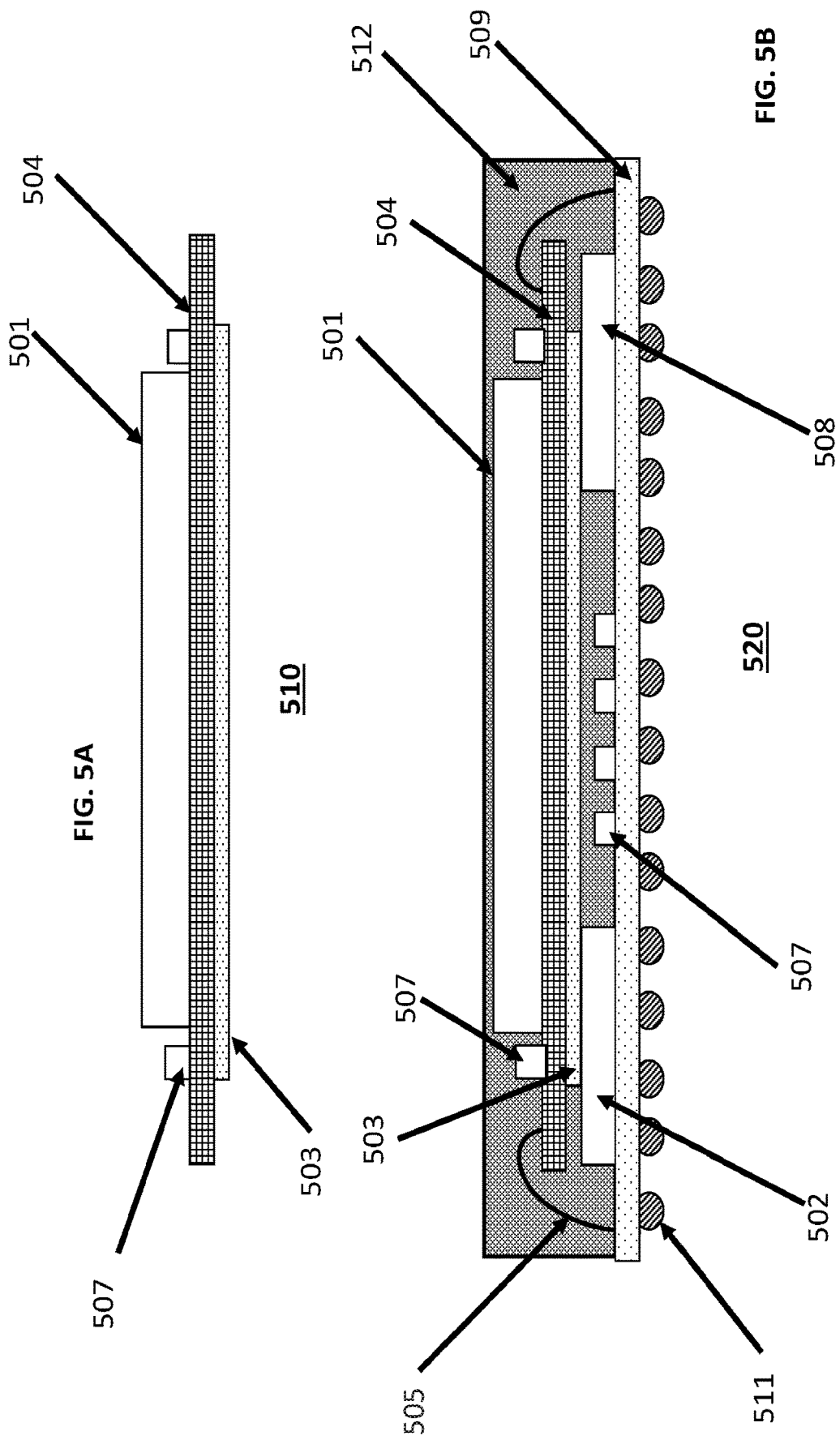

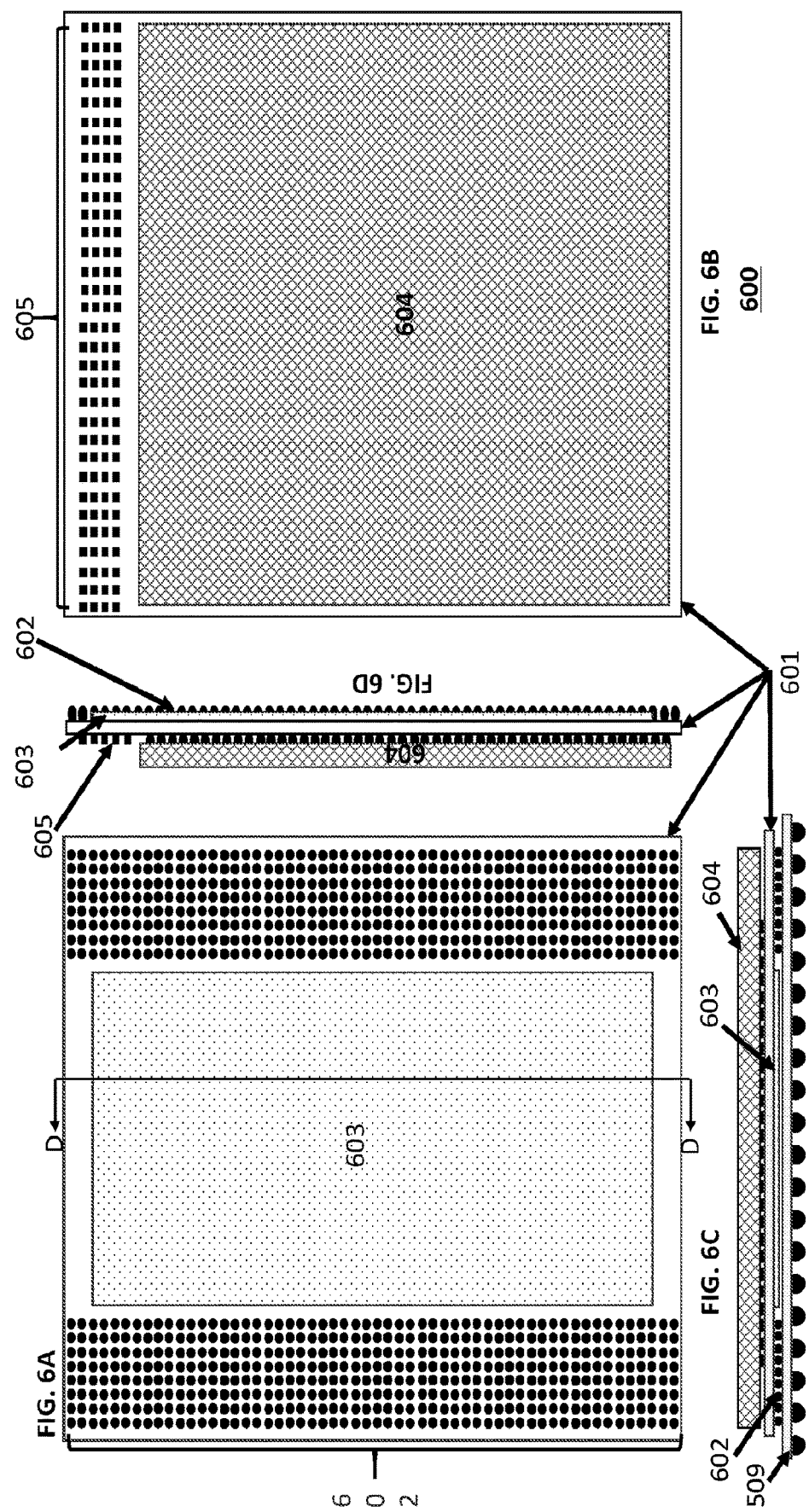

HIGH PERFORMANCE MODULE FOR SIP

CROSS REFERENCE TO RELATED APPLICATION(S)

This application is a 35 U.S.C. § 371 National Stage of International Patent Application No. PCT/US2018/055420, filed Oct. 11, 2018, designating the United States and claiming priority to U.S. Provisional Application No. 62/571,031, filed on Oct. 11, 2017. The above identified applications are incorporated by reference.

TECHNICAL FIELD

Aspects of this disclosure relate to a high performance module for use in System-in-Package ("SiP") devices.

BACKGROUND

System-on-a-Chip ("SoC") refers to a device currently used in the semiconductor industry that incorporates different functional circuit blocks on a single monolithic block of silicon to form one system circuit. System in a Package ("SiP") is currently used in the semiconductor industry, for instance, to assemble multiple integrated circuits, other devices, and passive components in one package.

SUMMARY

SiPs enable integration of devices with diverse device fabrication technologies such as digital, analog, memories and other devices and components such as discrete circuits, devices, sensors, power management, packaged and unpackaged components or devices, and other SiPs that are otherwise impossible or impractical to integrate in a single silicon circuit like an ASIC or SoC. These other discrete circuits may include, but are not limited to, non-silicon based circuits, such as organic, germanium, or GAN. SiPs are also attractive because they allow miniaturization of microelectronic systems from a printed circuit board tens of square cm in size to typically a single package a few square cm or less. A benefit of a SiP is that a SiP allows for building prototypes in order to test a system prior to further integration of some or all of the components into a single monolithic silicon circuit to produce a SoC.

Aspects of the present disclosure allow for simplification of system design by using an interposer. In some embodiments, the interposer is a second substrate in a SiP. An interposer may be used, for example, to further miniaturize the SiP by mounting and electrically interconnecting high performance components on the interposer to form a high performance module (HPM). The HPM may be for use in a SiP, and can be re-used in a plurality of different SiP systems.

According to some embodiments, a high performance module for a System-in-Package device comprises an interposer substrate having a top surface and a bottom surface; a first high speed component mounted on the top surface; and a second high speed component mounted on the bottom surface. In certain aspects, the first and second high speed components are arranged on the interposer substrate and interconnected using at least a portion of the interconnections of the substrate and configured to minimize any electrical distances and match signal paths to avoid signal timing delays between respective appropriate connections for the first and the second high speed components on the interposer substrate. In some embodiments, a third high speed component is mounted on the top surface, where the first high speed component is a high speed memory, the second high speed component is a processor, and the third high speed component is a high speed memory. Additionally, the first and the third high speed components may be stacked on each other and electrically connected using a second interposer substrate. In some embodiments, an encapsulant covers the first, second, and third high speed components in the SIP. The first high speed component may be, for example, a packaged memory or memory in die form and the second high speed component may be, for example, a processor or FPGA. The device may further comprise a device substrate, wherein the interposer is electrically connected to the device substrate using one or more of wires, a ball grid array, and clips, and one or more passive devices, wherein at least one of the passive devices is electrically connected to a high speed component of the device using the interposer substrate. In some embodiments, interconnections between high speed components are made using one or more vias and etched conductors in layers in the interposer substrate.

According to some embodiments, a packaged system is provided, which comprises a device substrate having a top surface and a bottom surface, wherein the bottom surface comprises one or more ball grid arrays; one or more high speed memories mounted on the top surface; a high speed processor mounted on the bottom surface; and an encapsulant layer surrounding at least the one or more high speed memories. In certain aspects, the one or more high speed memories and the high speed processor are arranged on the device substrate to minimize electrical interconnection distances between the one or more high speed memories and the high speed processor. Additionally, the packaged system may be arranged as a stand-alone component of a larger System-in-Package device.

According to some embodiments, a high performance module comprises an interposer substrate having a top surface and a bottom surface; a first high speed component mounted on the bottom surface; and a second high speed component mounted on the top surface, wherein the first and second high speed components are arranged on the interposer substrate to minimize electrical interconnection distances between the first and the second high speed components.

According to some embodiments, a high speed module for use in a System-in-Package device comprises an interposer substrate; a high speed memory mounted on the interposer; and a high speed component die mounted on a side of the interposer opposite that of the memory, wherein high speed interconnections for the memory are located adjacent and opposite the high speed interconnections for the die, wherein the high speed interconnections for the memory and the die are appropriately interconnected using vias and etched conductors in layers making up a portion of the interposer, and wherein any needed external connections for the memory and the die are located on a surface of the interposer. In some embodiments, the memory is at least one of: (i) packaged and (ii) in die form, the high speed component is at least one of: (i) processor and (ii) an FPGA, there are more than one memory stacked together, and/or the high speed component and memory are each a stand-alone device.

According to some embodiments, a processor and memory module for use in a System-in-Package device comprises a high speed memory, at least one high speed component die, an interposer substrate sized to mount the packaged high speed memory, and mount the at least one high speed component die on a side of the interposer opposite that of the memory, and for making appropriate high speed interconnections between the memory and the at least one die.

According to some embodiments a high performance System-in-Package device comprises at least one packaged high speed memory; at least one high speed component die; a substrate for the SIP sized to mount the packaged high speed memory, and mount the at least one high speed component die on a side of the interposer opposite that of the memory, and for making appropriate high speed interconnections between thy: memory and the at least one die; and a plurality of devices, components and passive devices mounted on the substrate and operatively interconnected.

According to some embodiments, a method of manufacturing a high performance module is provided. The method may begin, for instance, with obtaining an interposer substrate having an upper and lower surface. The method may further comprise attaching a first high speed component to one of the upper or lower surfaces, and attaching a second high speed component to the opposite upper or lower surfaces to form a high performance module. In certain aspects, the attaching the first and second high speed components to the interposer substrate makes the necessary high speed connections between the first and second high speed components, and the first and second high speed components are arranged on the interposer substrate to minimize electrical interconnection distances between the first and second high speed components. In some embodiments, the first high speed component is a high speed memory, and the second high speed component is a high speed processor. The method may further comprise attaching one or more components or passive devices to the upper or lower surfaces of the interposer substrate, encapsulating the interposer substrate, the first high speed component, and the second high speed component, and attaching the high performance module to a System-in-Package substrate using one or more of a ball grid array, wires, and clips.

According to some embodiments, the above methods and/or devices comprise electrically interconnected components that a located physically opposite each other (or as nearly as possible) on an interposer substrate to minimize the interconnection lengths and avoid complicated routing paths in the layers of the substrate. In some embodiments, the high speed interconnections between a high speed memory device and another high speed component made through an interposer substrate use bus bit widths of at least one of 8, 16, 32, and 64 bits.

These and other features of the disclosure will become apparent to those skilled in the art from the following detailed description of the disclosure, taken together with the accompanying drawings.

BRIEF DESCRIPTION OF THE DRAWINGS

FIG. 2A illustrates a top view of a SiP with a ball grid array using a high performance module, according to some embodiments.

FIG. 2B illustrates a side view of a SiP with a ball grid array using a high performance module, according to some embodiments.

FIG. 4A illustrates a top view of a SiP with a high performance module using one interposer according to some embodiments.

FIG. 4B illustrates a side view of a SiP with a high performance module using one interposer according to some embodiments.

FIG. 5A illustrates a side view of a high performance module according to some embodiments.

FIG. 5B illustrates a side view of a high performance SiP with a high performance module in according to some embodiments.

FIG. 6A illustrates details of a bottom view of a high performance module according to some embodiments.

FIG. 6B illustrates details of a top view of a high performance module according to some embodiments.

FIG. 6C illustrates details of a side view of an unpackaged high performance SiP with a high performance module according to some embodiments.

FIG. 6D illustrates details of a side view of a high performance module according to some embodiments.

DETAILED DESCRIPTION

As used herein, the term "high performance" or "high speed" is used to mean components with fast operational parameters for a given field or device type. By way of example, clock rates for high performance or high speed devices may be at least 1 Giga-Hertz or greater, and may also include analog or mixed signal components or devices, as well as sensors, power management, packaged and unpackaged components or devices, or non-silicon based circuits. Also, an interposer may be used as a substrate in a SiP that is "floating" and may not have any direct, external electrical connections as all its connections may be internal to the SiP in which it is included. As used herein, a processor may include, for example, a digital microprocessor, analog processor, FPGA, or mixed signal processor.

Figure 1A:
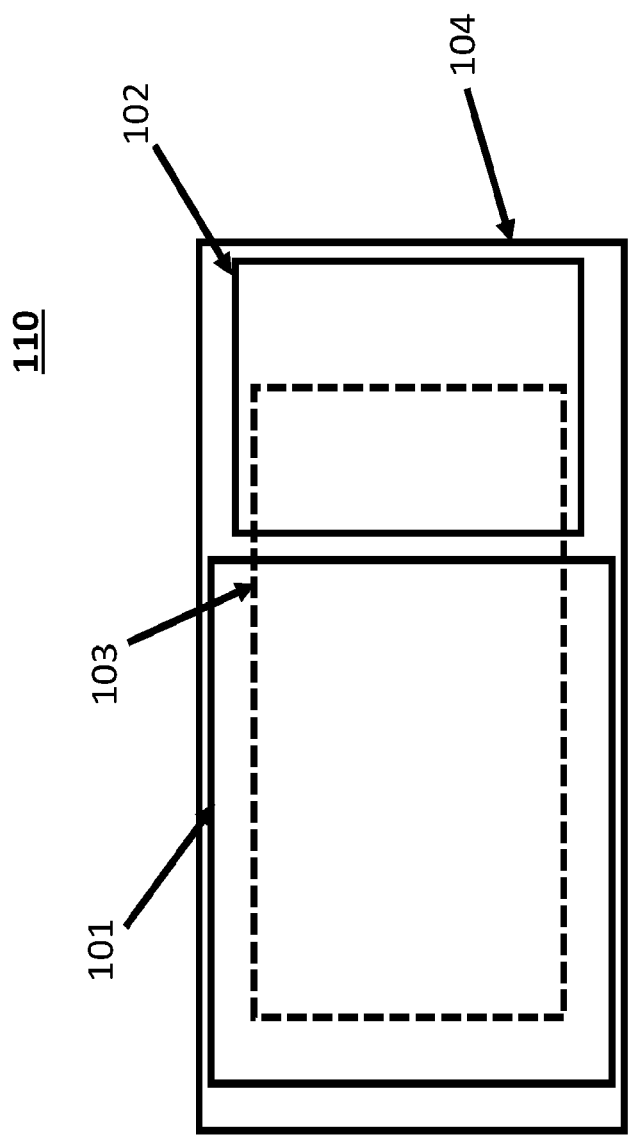
FIG. 1A illustrates a top view of a high performance module according to some embodiments.
Figure 1B:
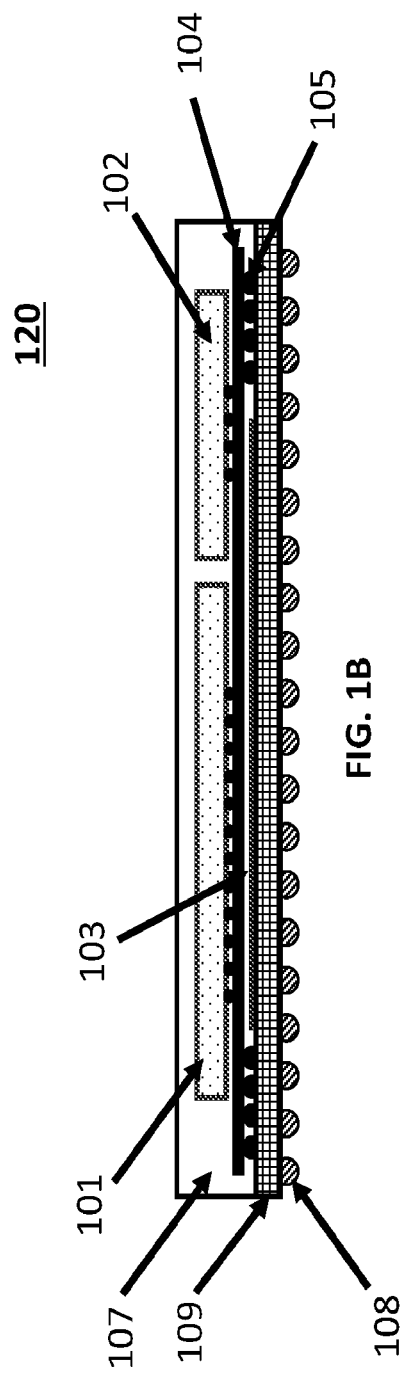
FIGS. 1B-C illustrate side views of a SiP using a high performance module according to some embodiments.
Figure 1C:
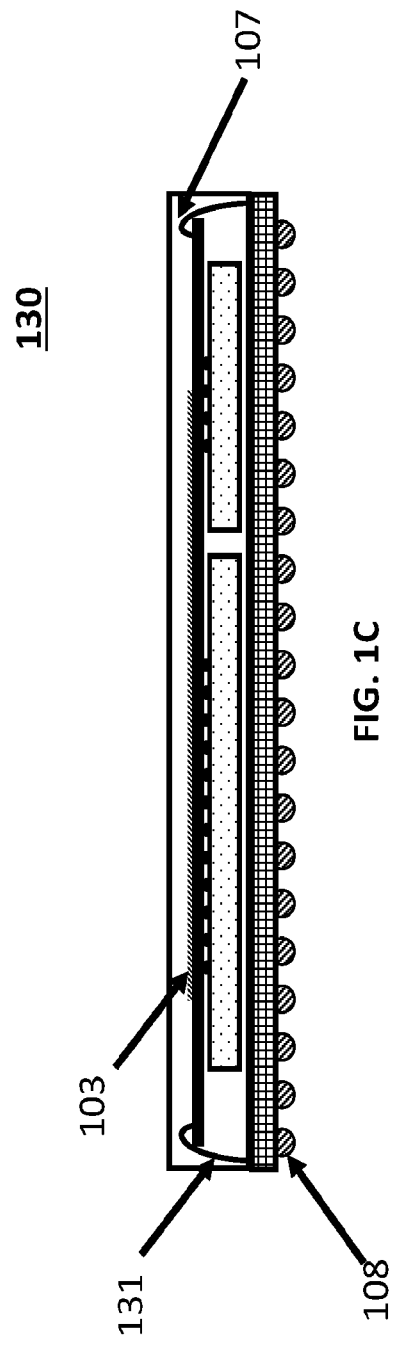

FIGS. 1A-1E illustrate multiple views of a high performance module (HPM) 100 and its use in a System-in-Package (SiP), according to some embodiments. FIG. 1A illustrates an HPM 110 in a see through top view with a dashed line outlining a component under an interposer. FIG. 1A illustrates one embodiment of an HPM that includes an interposer substrate 104, memories 101 and 102, and a processor 103. FIG. 1B illustrates a side view of a SiP 120 using an HPM 110 in a first component configuration and FIG. 1C illustrates a side view of a SiP 130 using an HPM in a second component configuration, according to some embodiments. For instance, FIG. 1B illustrates a SiP with an HPM and the processor on the bottom, while FIG. 1C illustrates a SiP with an HPM with the processor on top. In these FIGS. 1A-E, and according to some embodiments, a high speed processor 103 is used as an example of a high performance component.

Further referring to FIGS. 1B-C, an HPM according to some embodiments includes an interposer substrate 104, and memory devices 101, 102 on a first side of the interposer substrate 104, and a high performance component (e.g., processor) 103 on opposite sides of the interposer substrate 104, according to some embodiments. The memories as well as other devices and/or components may be packaged or as bare die.

The configuration of a SiP 120 illustrated in FIG. 1B shows a high performance module (HPM) 110 with the memory devices 101, 102 on a top surface of the interposer substrate 104 and the processor 103 located on the opposite surface of the interposer substrate 104. The HPM 110 is electrically connected to the substrate 109 of the SiP 120 using balls 105 in a ball grid array. Finally the SiP 120 is encapsulated 107 and balls 108 are attached for external connections to the SiP.

The configuration of SiP 130 illustrated in FIG. 1C shows a high performance module (HPM) with a processor 103 on the top surface of the interposer substrate 104 and the memory devices 101, 102 on the opposite surface of the interposer substrate 104, The HPM 110 is electrically connected to the substrate 109 using bond wires 131. Finally the SIP 130 is encapsulated 107 and balls 108 are attached for external connections.

In some embodiments, the high performance processor 103 may be attached to the interposer substrate 104 using flip chip technology and the memory devices 101, 102 associated with the high performance processor 103 attached to the opposite side of the same interposer 104 to form a high performance module (HPM). In some embodiments, the processor 103 and memory devices 101 and 102 may be electrically interconnected using circuitry on and internal to interposer substrate 104, for instance, as described with respect to FIG. 1D. In some embodiments, the high performance module (HPM) is there attached to the SiP substrate 109 using a ball grid array 105, as shown in the SiP configuration 120 illustrated in FIG. 113. In some embodiments, the high performance processor 103 may also be appropriately thermally connected to the substrate 109 to help conduct away any heat generated by components and devices in the SiP. In some embodiments, bond wires 131 may be used to connect the interposer 104 to the SiP substrate 109 to attach the high performance module (HPM) 110 to the substrate 109, as shown in the SiP configuration 130 illustrated in FIG. 1C.

In some embodiments, alternative connection methods and devices other than bonds wires 131 may be employed to conduct excessive currents and associated heat. For example, clips (not shown) may be used to electrically connect the interposer 104 to the SiP substrate 109. One such method may use metallic clip devices made of conductive metals or alloys that are used to supply power and ground connections, but the other non-power connections may continue to use bond wires. Finally, a second ball grid array 108 may be used to interconnect the SiP 120 or 130 to external circuitry, as shown in FIGS. 1B-C. In both SiP configurations 120, 130 illustrated in FIGS. 1B-C, the SiP may be encapsulated 107 to form a packaged SiP device. In some embodiments, methods may be used to conduct heat from the components or devices of the interposer 104 to a top surface of the encapsulation 107. These methods may include adding thermally conductive materials between the components on the top surface of the interposer and the topmost surface of the encapsulant 107, for instance, as described with respect to FIG. 1E.

Figure 1D:
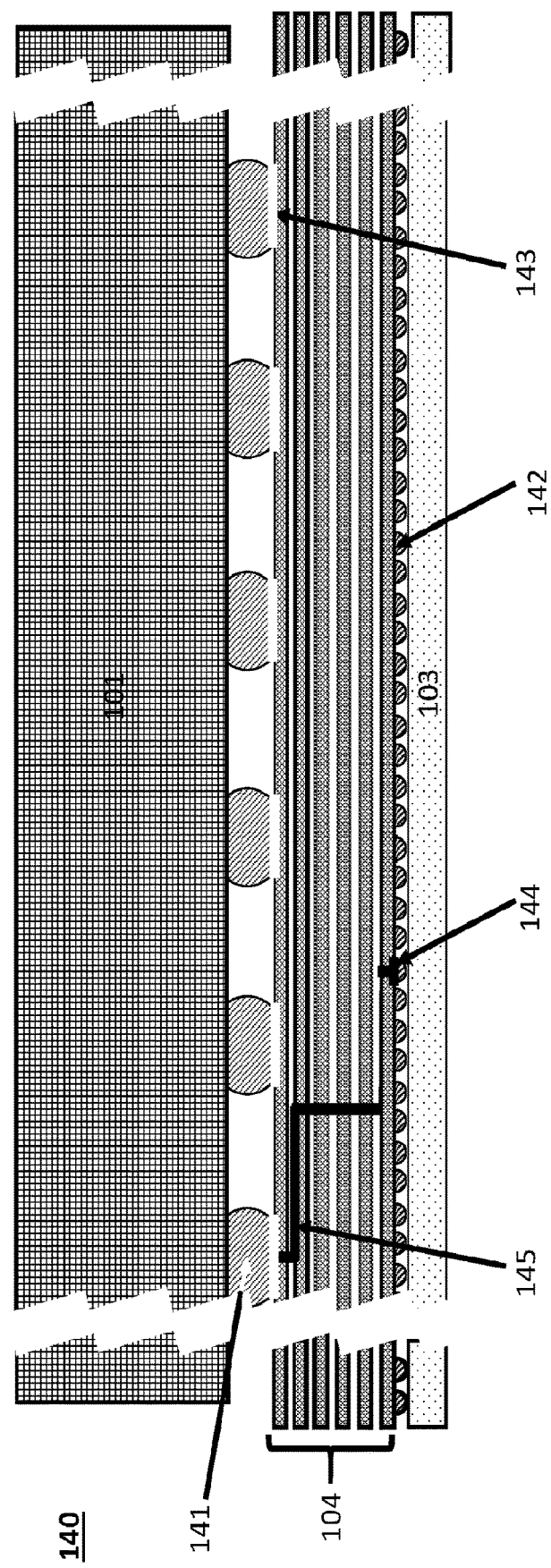
FIG. 1D illustrates a view of a portion of a cross section of a SiP using a high performance module according to some embodiments.

FIG. 1D illustrates an exploded view of a portion of a cross section of an HPM, such as HPM 110 of FIG. 1B, which includes a processor 103, a memory (DDR) 101, and a layered interposer substrate 104. In certain aspects, FIG. 1D illustrates how simplified interconnections 145 between a processor ball 144 and a memory ball 141 can be achieved using the various conductive layers and vias that make up at least a portion of the interposer 104, according to some embodiments. The processor balls 142, 144 may be attached electrically (e.g., using solder paste) to pads similar to those depicted for memory 101 as pads 143, 144 on a surface of the interposer 104. The number of layers for the interposer 104 illustrated in FIG. 1D is merely one representation; more layers or fewer layers may be employed depending on a function of the number of layers needed to make the necessary high speed interconnections for the high performance components or devices and any other types of interconnections to be made using the interconnections in interposer 104. The interposer substrate 104 may have multiple spaced apart conductive layers which may be etched or otherwise created to provide conductors in specific patterns of unique conductive routing lines or configurations within each conductive layer and vias for interconnections between layers and interconnection pads; these patterns be used to interconnect the different components on the substrate 104 and to connect with portions of a SIP substrate on which the substrate 104 may be located. The use of high speed and/or performance devices on an interposer substrate 104 allow for optimizing their respective interconnections to allow for optimum connection lengths with minimum cross-talk. Flip Chip methods may also be used to electrically attach the processor103 to the interposer 104.

Figure 1E:
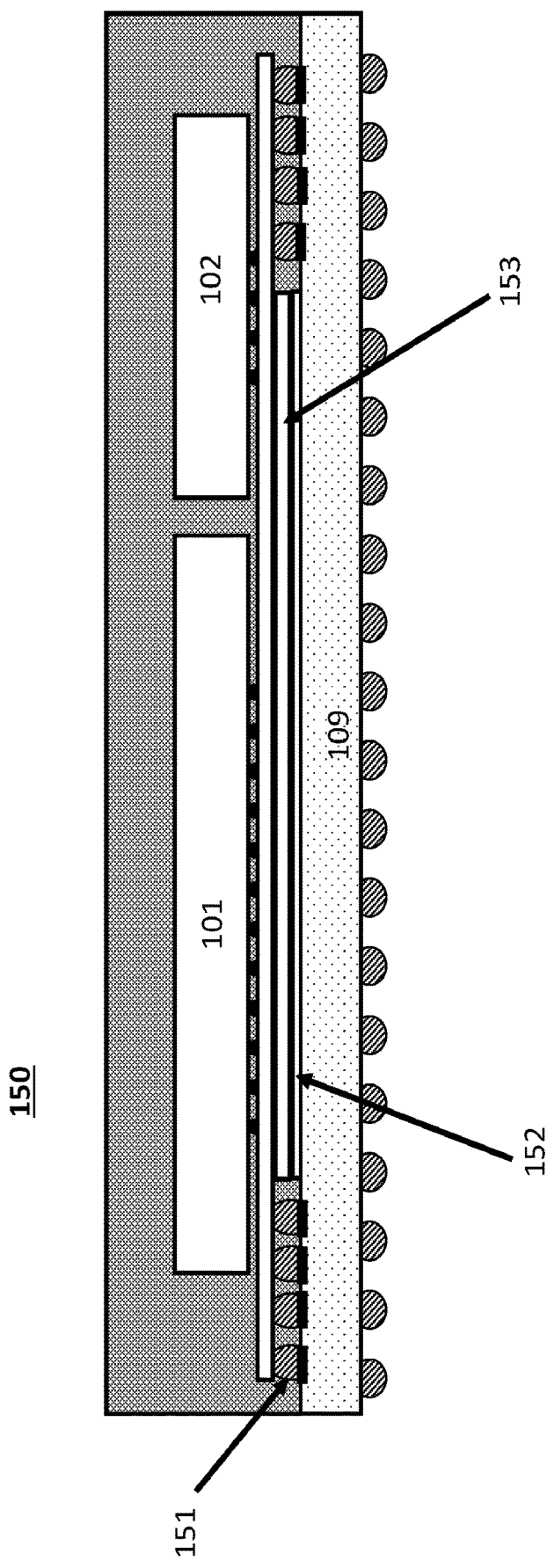
FIG. 1E illustrates a side view of a SiP using a high performance module according to some embodiments.

FIG. 1E illustrates the use of a thermal element 152 according to some embodiments. For instance, element 152 may be added to the high performance module 110 of FIG. 1B, which comprises a processor 103 (similar to 153 of this embodiment), a memory (e.g., DDR) 101, a memory 102, and an interposer substrate 104, according to some embodiments. As shown in FIG. 1E, balls and pads 151 may serve to electrically connect the interposer 104 with the SiP substrate 109, according to some embodiments. Additionally, the thermal element 152 may be configured to transmit heat from the SiP 150 and processor 153 to a component on which the SiP 150 is mounted and to which it is connected. For embodiments of the SIP 150, when the processor module is mounted on and electrically connected to the SiP substrate 109, an appropriate thermal element 152 may be appropriately employed between the SiP substrate 109 and the bottom-most component attached to the interposer 104 to help dissipate heat from the high performance module and the SiP 150. In some embodiments, the thermal element 152 may be for example, but not limited to, a paste, a component, or pad, or similar heat conducting items.

While FIGS. 1A-E illustrate a high performance processor or microprocessor module, other high speed components, that may or may not include a processor, may be employed in these configurations. In some embodiments, the other high speed components may be digital, analog or mixed signal devices. In addition, the high speed interconnections between the high speed memory device and the high speed components made through the interposer substrate 104 may be made using a variety of bus bit widths. Such bus bit widths may be 8, 16, 32, 64 or any other convenient bit width that depends upon the design and capacity of the memory devices and high speed components employed in a high performance module. Similarly, memory devices and the high speed components may be arranged so that the portions of the connections for the memory devices and the high speed components that require minimum lengths for interconnection for maximum operational speed between the memory devices and the high speed components, or more components mounted on the interposer 104, may be located physically opposite each other (or as nearly as possible) on the interposer 104 to minimize any desired interconnection lengths and avoid complicated routing paths in the layers of the interposer substrate 104. Additional advantages for the above noted method of arranging the components may include, but are not limited to, a reduction in the number of bypass capacitors required, reduced noise introduced into signals, and reduction of stray inductance, among others.

FIG. 2A illustrates a see through top view of a SiP 200 with the processor 103 mounted on a bottom surface of a SiP substrate 205 adjacent a SiP ball grid array 202 used to make external connections, according to some embodiments. FIG. 2B illustrates a side view of the SiP 200 with the processor 103 mounted on the bottom surface of the SiP substrate 205 adjacent the SiP ball grid array 202 used to make external connections. The SiP 200 comprises an alternative embodiment of arrangement of a high performance module (HPM) which does not include the interposer substrate 104, as illustrated in FIGS. 1A-E, but does include a high performance processor 103 appropriately interconnected with other high speed or high performance components or devices appropriately mounted on the other side of the SiP substrate 205.

As shown in FIGS. 2A-B, the SiP 200 comprises the processor 103 mounted on a bottom surface of the SiP substrate 205 with a Ball Grid Array 202 for making external connections for the SiP 200 and the processor 103 is attached to a substrate 205 using flip chip technology. According to some embodiments, SiP 200 may be mounted on and electrically connected to a device, component or circuit board, where the device, component or circuit board may have an appropriate thermal dissipation element, for example, but not limited to, a paste, component or pad appropriately positioned in the SIP 200 to help dissipate heat from the SiP 200, as described with respect to FIG. 1E.

Figure 3A:
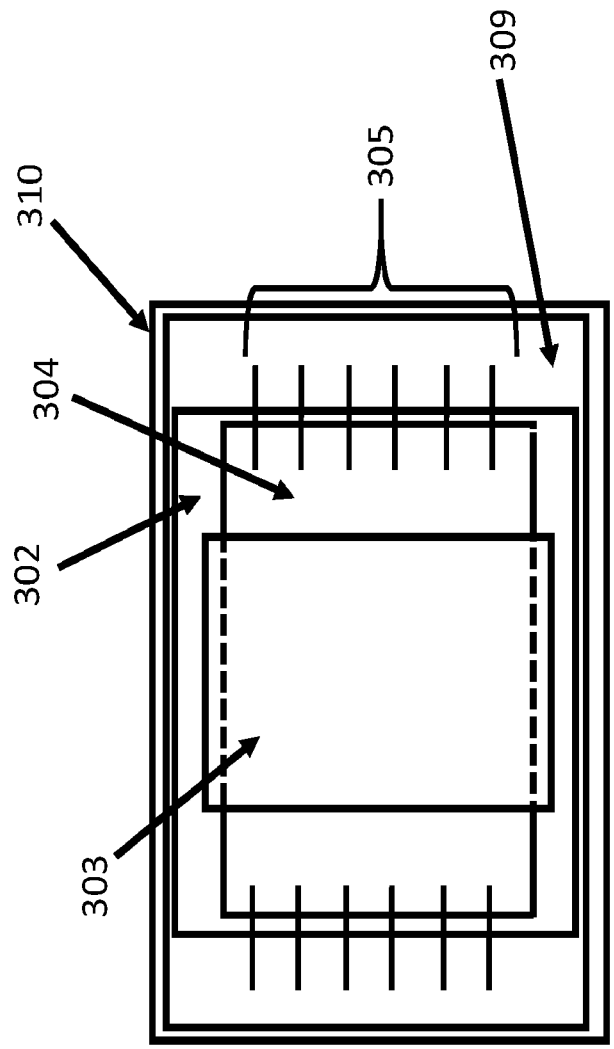
FIG. 3A illustrates a top view of a SiP with a high performance module having two interposers according to some embodiments.
Figure 3B:
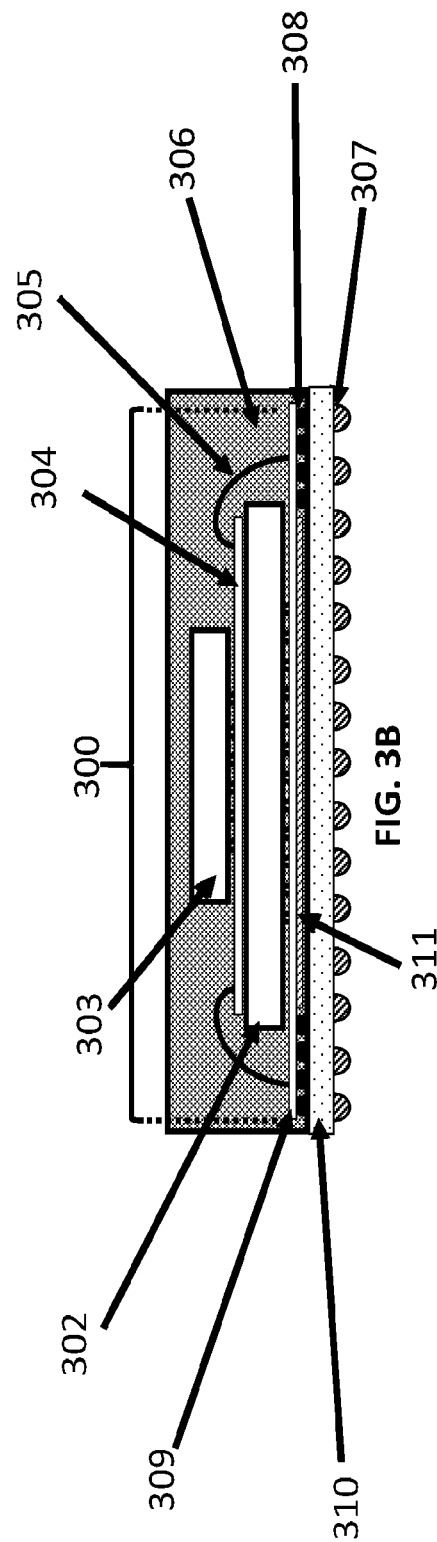
FIG. 3B illustrates a side view of a SiP with a high performance module having two interposers according to some embodiments.

FIG. 3A illustrates a see through top view of a SiP 350 with a high performance module using two interposers 304, 309, in accordance with some embodiments. FIG. 3B illustrates a side view of the SiP 350 with HPM 300. In some embodiments, a first memory device 303 may be attached to a top surface of a first interposer substrate 304 and substrate 304 may be electrically attached to a second interposer substrate 309 using bond wires 305. Further, the second interposer substrate 309 may be appropriately connected to the SiP 350 substrate 310. A processor 311 may be mounted on a bottom surface of the second interposer 309 and electrically connected to the second interposer substrate 309. A second memory device 302 may be mounted on a top surface of the second interposer 309 and electrically connected to the second interposer 309 as well as processor 311. Embodiments allow for different physical arrangements of these components and devices to be employed. In some embodiments, other devices may be substituted for memories 302, 303 depending upon system needs. The second interposer 309 may be electrically attached to the SiP substrate 310 with a ball grid array 308. The SIP 350 may be encapsulated 306 to protect the devices, e.g., the memory devices 302, 303, the interposer substrates 302, 309, and the processor 311, along with other SiP components and devices. In some embodiments, the SiP 350 may have a ball grid array 307 attached to the bottom of the substrate 310 configured to electrically connect the SIP 350 to external components. For ease of description, other components of the SiP 300 and the HPM interposers 304, 309 have been left off. According to embodiments, the HPM 300 can be one of many components attached to the SiP substrate 310.

FIG. 4A illustrates a see through top view of a SiP 450 having a processor 103 and a memory device 101 electrically interconnected via the interposer substrate 104, according to some embodiments. FIG. 4B illustrates a side view of the SiP 450. In some embodiments, a high performance module (HPM) 400 is attached to a substrate 454 of the SiP 450 using bond wires 453. This configuration allows additional components 452, 457 of the SiP 450 to be attached to the substrate 454 while positioned under the HPM. In some embodiments, the SiP 450 is encapsulated 455 and a bottom surface of the processor 103 may or may not contact a top surface of any of the additional components on SiP substrate 454. In some embodiments, clips may be used for power and ground connections to interposer 104. For ease of description, other components of the SiP 450 and HPM interposer substrate 104 have been left off. In some embodiments, the HPM 400 could be one of many components attached to the SiP substrate 454.

FIGS. 5A-B illustrate different arrangements of a high performance module (HPM) 510, according to some embodiments. In some embodiments, the high performance module 510 may include an interposer substrate 504, a processor 503, associated memory device (e.g., DDR) 501 and one or more passive components 507. In some embodiments, passive components 507 may be, but not limited to, bypass capacitors, resistors, and other active and passive components. In some embodiments, the HPM substrate 504 may further include landing pads configured to connect other components using bond wires on the HPM 510. As shown in FIGS. 5A-B, the memory device 501 and the passive components 507 may be attached to a top surface of the interposer substrate 504. In some embodiments, the processor 503 may be attached to a bottom surface of the interposer substrate 504. According to embodiments, different physical arrangements of components and devices may be employed in an HPM. As shown in FIG. 5B, the high performance module 510 may be attached to a SiP 520 substrate 509 and electrically connected using bond wires 505 (or using other methods as shown in FIGS. 1-4), according to some embodiments. In some embodiments, other components 502, 508 may be needed to complete the system design and may be electrically attached to an appropriate surface of the SiP substrate 509. For example, the other components 502, 507, 508 may be for example, but not limited to, additional memory devices and/or additional passive components. In some embodiments, connections may be made to the external circuits using a ball grid array 511 on the bottom of the SiP substrate 509 and the SIP may be encapsulated 512.

In some embodiments, a complete SiP assembly 520 may include a high performance module 510, the bond wires 505, additional passive components 508, and the SIP substrate 509, as shown in FIG. 5B. For ease of description, other components of the SiP 520 have been left off. According to embodiments, the RPM could be one of many components attached to the SiP substrate 509.

FIGS. 6A-D illustrate a high performance module, such as 510 described in FIGS. 5A-B. FIG. 6A illustrates a bottom view of the high performance module (HPM), according to some embodiments. FIG. 6B illustrates a top view of the HPM, according to some embodiments. FIGS. 6C and 6D illustrate side views of the HPM, according to some embodiments. FIG. 6C includes the SiP substrate 509 on which the high performance module 510 is mounted. As shown in FIGS. 6A-D, a processor 603, a memory device 604, passive components 605 and a ball grid array 602 for operative interconnections to a SiP substrate 509 may be attached to a top or bottom surface of the interposer substrate 601. Although memory 604 is illustrated as a single device it may be multiple memory devices in this space or elsewhere on interposer 601. For ease of description, other components of the SiP have been omitted in this example. However, and according to embodiments, the could be one of many components attached to the SiP substrate 509.

Figure 7A:
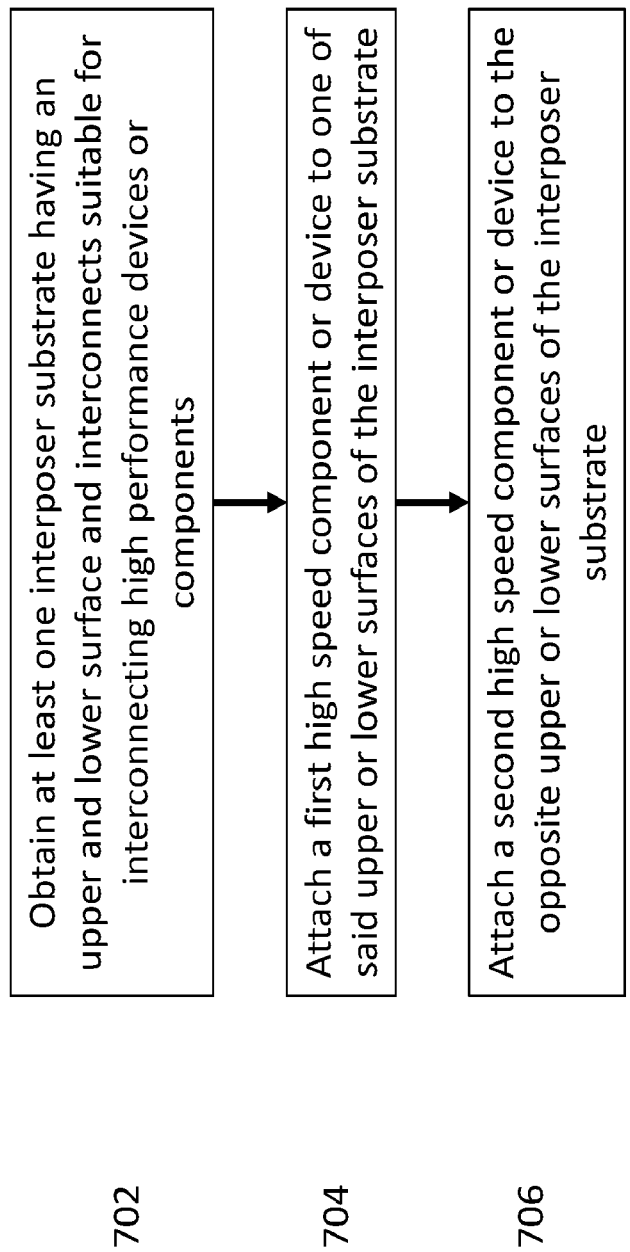
FIGS. 7A-D are flow charts illustrating processes for manufacturing a high performance module according to some embodiments.

Referring now to FIG. 7A, according to some embodiments, a process 700 for manufacturing a high performance module is provided. Process 700 may be used, for instance, in connection with the HPMs and SIPs of FIGS. 2-6.

The process may begin, for instance, with step 702 in which an interposer substrate having an upper and lower surface and appropriate interconnections is obtained. According to embodiments, the interposer is appropriately configured in etched layers and/or vias for making interconnections between the components or devices to be mounted on and connected to the interposer external connectors. In step 704, a first high speed component is attached to one of the upper or lower surfaces. In step 706, a second high speed component is attached to the opposite upper or lower surfaces, wherein attaching the first and second high speed components to the interposer substrate makes the necessary high speed connections between the first and second high speed components, and wherein the first and second high speed components are arranged on the interposer substrate to take advantage of conductive patterns in layers and/or vias of the substrate arranged to minimize any electrical distance between the appropriate interconnections for the first and second high speed components. In some embodiments, the first high speed component s a high speed memory, and the second high speed component is a high speed processor. In some embodiments, the high performance module may be attached to a SiP substrate or another HPM using for example, but not limited to, one or more of a ball grid array, bond wires, and clips.

Figure 7B:
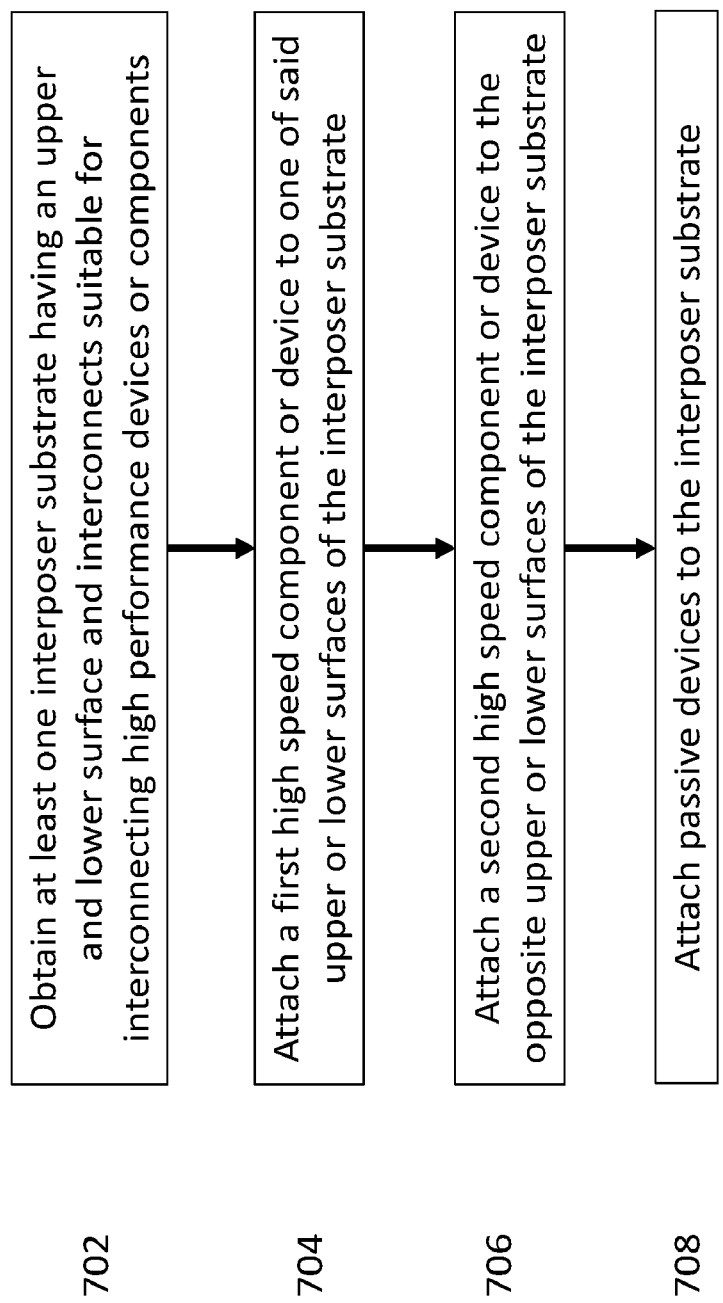
Figure 7C:
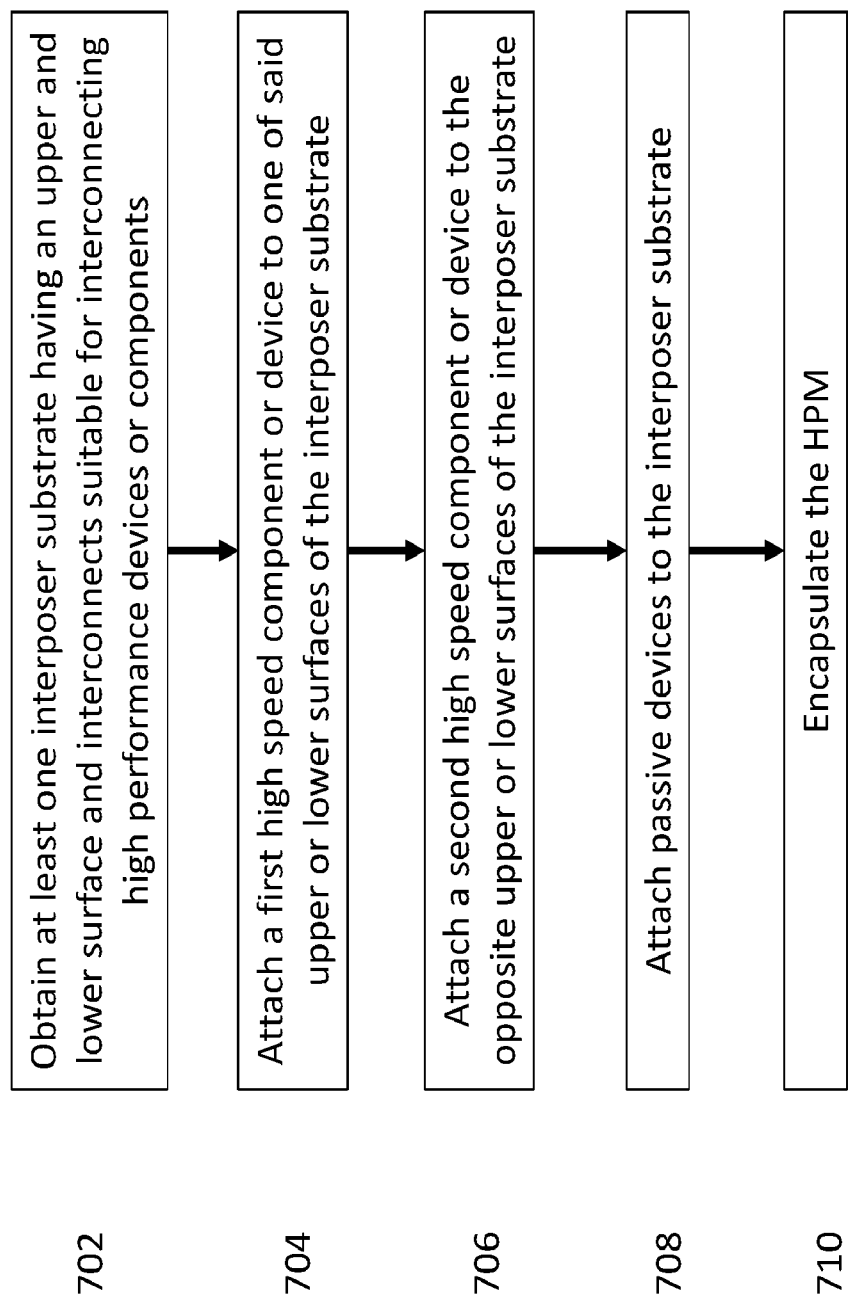
Figure 7D:
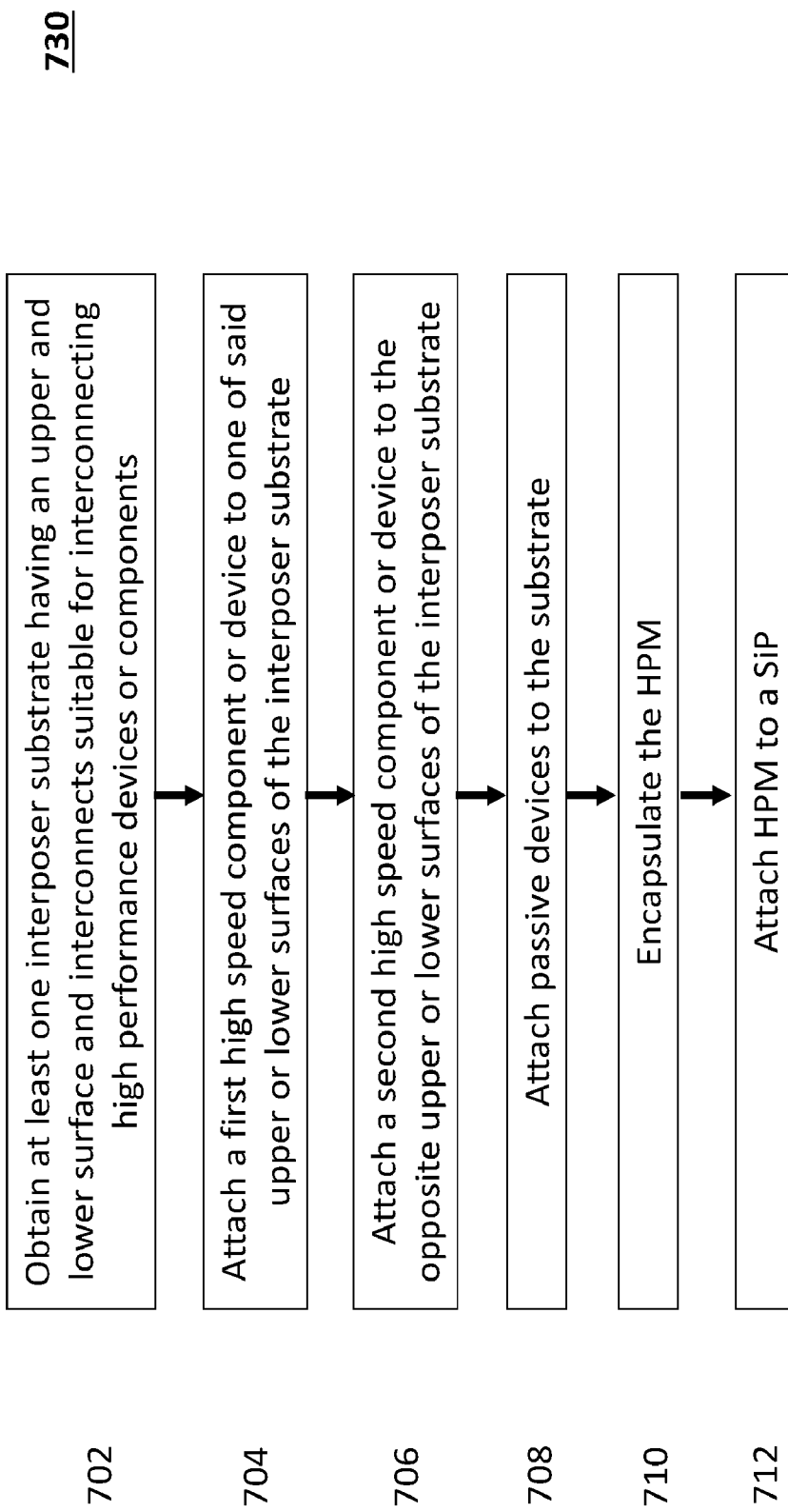

In some embodiments, as illustrated in FIG. 7B, the process 700 further includes a step 708 of attaching one or more passive devices or components to the upper or lower surfaces of an interposer substrate. In some embodiments, as illustrated in FIG. 7C the process 700 further includes a step 710 of encapsulating the interposer substrate(s), the first high speed component, and the second high speed component and any passive devices or components. In some embodiments, as illustrated in FIG. 7D the process 700 further includes a step 712 of attaching the HPM to a SiP. In some embodiments, process 700 comprises forming an interposer substrate based upon the high performance devices and/or components and passive devices or components to be attached to it and their optimal interconnections for maximum performance and then incorporation into a SiP.

In some embodiments, step 712 may comprise manufacturing a System-in-Package (SiP) device by attaching a high performance module manufactured in steps 702, 704, 706, 708, 710 to a SIP substrate. In some embodiments, the high performance module is attached to the SIP substrate using one or more of a ball grid array, wires, and clips.

While the present disclosure has been described with respect to the embodiments set forth above, the present disclosure is not limited to these embodiments. Accordingly, other embodiments, variations, and improvements not described herein are not excluded from the scope of the present disclosure. Such variations include but are not limited to new substrate material, different kinds of devices or components attached to the substrate not discussed, or new packaging concepts.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A System-in-Package (SiP) device, the SiP device comprising:
   a SiP substrate having a top surface and a bottom surface;
   a plurality of conductors arranged on the bottom surface of the SiP substrate;
   a multi-layer interposer substrate having a first surface and a second surface that is opposite to the first surface, wherein the multi-layer interposer substrate is disposed on the top surface side of the SiP substrate;
   a first active component mounted, directly or indirectly, on one of the first and second surfaces of the multi-layer interposer substrate;
   a second active component mounted, directly or indirectly, on another of the first and second surfaces of the multi-layer interposer substrate; and
   a third active component that is positioned adjacent the first active component on the multi-layer interposer substrate, wherein the first and third active components are interconnected to each other using one or more conductive traces and one or more vias of the multi-layer interposer substrate, wherein;
   the first and second active components are arranged on the multi-layer interposer substrate and interconnected using one or more conductive traces and one or more vias of the multi-layer interposer substrate, and wherein the first and second active components have clock speeds greater than or equal to 1 Giga-Hertz.

2. A method of manufacturing a System-in-Package (SiP) device, the method comprising:
   obtaining a SiP substrate having a top surface and a bottom surface;
   obtaining a multi-layer interposer substrate having a first surface and a second surface opposite to the first surface;
   attaching a first component to the multi-layer interposer substrate on one of the first and second surface sides of the multi-layer interposer substrate;
   attaching a second component to the multi-layer interposer substrate on another of the first and second surface sides of the multi-layer interposer substrate; and
   attaching a third component to the multi-layer interposer substrate adjacent the first component, wherein
   a plurality of conductors are arranged on the bottom surface of the SiP substrate,
   the multi-layer interposer substrate is disposed on the top surface side of the SiP substrate, and
   attaching the first and second components to the multi-layer interposer substrate is for making one or more electrical connections between the first and second components using one or more conductive traces and one or more vias of the multi-layer interposer substrate, and
   attaching the third component to the multi-layer interposer substrate is for making one or more electrical connections between the first and third components using one or more conductive traces and one or more vias of the multi-layer interposer substrate.

3. The method of claim 2, wherein the first component is a memory, and the second component is a processor.

4. The method of claim 3, further comprising:
attaching one or more passive devices to the multi-layer interposer substrate on the first surface side or the second surface side of the multi-layer interposer substrate.

5. The method of claim 2, the method further comprising:
attaching the multi-layer interposer substrate to the SiP substrate on the top surface side of the SiP substrate using one or more of a ball grid array, wires, and clips.

6. The device of claim 1, wherein
the first active component comprises a processor, and
the second active component comprises at least one memory.

7. The method of claim 2, wherein the first and second components are high speed components that have clock speeds greater than or equal to 1 Giga-Hertz.

8. The device of claim 1, wherein the multi-layer interposer substrate is electrically connected to the SiP substrate using wires.

9. The device of claim 1, the device further comprising one or more passive devices attached to the bottom surface of the SiP substrate.

10. The device of claim 1, wherein the plurality of vias and conductive traces of the multi-layer interposer substrate comprise: (i) a first signal path between a first connecting point of the first active component and an associated connecting point of the second active component; and (ii) a second signal path between a second connecting point of the first active component and an associated connecting point of the second active component, and wherein the first and second signal paths are the same length.

11. The device of claim 1, wherein the connecting paths are arranged such that the length of any signal path between the first and second active components are minimized.

12. The device of claim 1, wherein the connecting paths are arranged such that signal timing delays between the first and second components are minimized.

13. The device of claim 1, wherein the active first component is a memory, the second active component is a processor, and the third active component is a memory.

14. The device of claim 1, wherein:
the first active component is at least one of: (i) a packaged memory and (ii) a memory in die form,
the second active component is at least one of: (i) a processor and (ii) a programmable logic device,
the third active component is at least one of: (i) a packaged memory and (ii) a memory in die form, and
the first and second active components and the first and third components are connected using one or more buses having bus bit widths of at least one of 8, 16, 32, and 64 bits.

15. The device of claim 1, wherein the multi-layer interposer substrate is electrically connected to the SiP substrate using one or more of wires, a ball grid array, and clips.

16. The device of claim 1, further comprising:
one or more passive devices, wherein at least one of said passive devices is electrically connected to one of the first and second components using the multi-layer interposer substrate.

* * * * *